United States Patent [19]
Okada et al.

[11] Patent Number: 5,012,198
[45] Date of Patent: Apr. 30, 1991

[54] DIGITAL PLL CIRCUIT HAVING REDUCED LEAD-IN TIME

[75] Inventors: Hiroshi Okada, Tokyo; Noritaka Saitoh, Kawasaki; Hidetomo Akabane, Kawasaki; Shintaro Tashiro, Kawasaki, all of Japan

[73] Assignee: Mitsubishi Rayon Company, Ltd., Tokyo, Japan

[21] Appl. No.: 413,487

[22] Filed: Sep. 27, 1989

[30] Foreign Application Priority Data

Sep. 29, 1988 [JP] Japan ............................ 63-242472

[51] Int. Cl.$^5$ .................... H03K 5/00; H03K 5/13; H03K 5/22
[52] U.S. Cl. ................................ 328/155; 307/262
[58] Field of Search ............... 307/262, 510, 269; 328/155, 61, 63; 331/1 A, 25; 375/118, 119, 120

[56] References Cited

U.S. PATENT DOCUMENTS 4,841,167 6/1989 Saegusa ........................... 307/269
4,849,703 7/1989 Easley et al. .................... 328/155
4,893,087 1/1990 Davis ............................... 328/155

FOREIGN PATENT DOCUMENTS 49-11008  1/1974 Japan.
61-63111  4/1986 Japan.
61-208923 9/1986 Japan.
62-110320 5/1987 Japan.
63-67823  3/1988 Japan.

Primary Examiner—Timothy P. Callahan
Attorney, Agent, or Firm—Oblon, Spivak, McClelland, Maier & Neustadt

[57] ABSTRACT

A digital PLL circuit to output a clock signal phase-synchronized with an input signal comprises a divider outputting the clock signal and a signal initiation pulse generator generating a signal to set the divider to a predetermined state depending on the input signal initiation. The maximum lead-in time is reduced to 1/n in comparison with prior art, and therefore the circuit is very suitable for use in the receiving part of a device which receives a burst data signal.

5 Claims, 5 Drawing Sheets

# DIGITAL PLL CIRCUIT HAVING REDUCED LEAD-IN TIME

BACKGROUND OF THE INVENTION

1. Field of the Invention

This invention relates to a digital PLL (Phase Locked Loop) circuit. More particularly, this invention relates to a digital PLL circuit adapted for use in a receiving part of a relay or a terminal device which receives a burst data signal in a communication network.

2. Description of the Related Art

A digital PLL circuit for generating a clock signal having a frequency which is phase-synchronized with an input signal is disclosed in Japanese Unexamined Patent Publication (Kokai) No. 61-208923.

The circuit comprises a fixed frequency generator, a delay circuit which delays the output signal of the fixed frequency generator to make multiple output signals having a phase difference between each other, a phase changing circuit which selects one of the output signals of the delay circuit, a divider which divides a frequency of the output signal of the phase changing circuit to make an output signal of the whole circuit, a phase comparator which compares the phase of the output signal with the phase of the input signal of the whole circuit, and a phase control pulse generator which controls the phase changing circuit depending on the result of the comparison in the phase comparator.

In the circuit according to the prior art, a considerable lead-in time may be required when receiving a burst signal, because multiple phase comparisons and changes are required to perform phase synchronization if the phase difference between the output signal and the input signal is 180°.

SUMMARY OF THE INVENTION

An object of the present invention is to provide a digital PLL circuit which performs a lead-in operation immediately, however large the difference existing between the phases of the input and output signals in the initial lead-in operation.

In accordance with the present invention there is provided a digital PLL circuit to output a clock signal phase-synchronized with an input signal comprising a fixed frequency generator generating an output signal having a frequency which is n-times as large as a frequency $f_0$ of the clock signal, a delay circuit generating a plurality of signals formed by giving predetermined and various phase differences to the output signal of said fixed frequency generator, a phase changing circuit successively selecting one of said plurality of signals depending on a control input to output the selected signal, a divider dividing a frequency of the output signal of said phase changing circuit by n to output said clock signal, a phase comparator comparing a phase of said clock signal with a phase of said input signal, and a phase control pulse generator outputting a control signal to said phase changing circuit depending on a result of comparison of said phase comparator, characterized in that said divider can be set to a predetermined state, and that the digital PLL circuit further comprises a signal initiation pulse generator generating a signal to set said divider to a predetermined state depending on input signal initiation.

DESCRIPTION OF THE PREFERRED EMBODIMENTS

Before describing the preferred embodiments according to the invention, an example of aforementioned related art is given with reference to the accompanying drawing.

Figure 1:
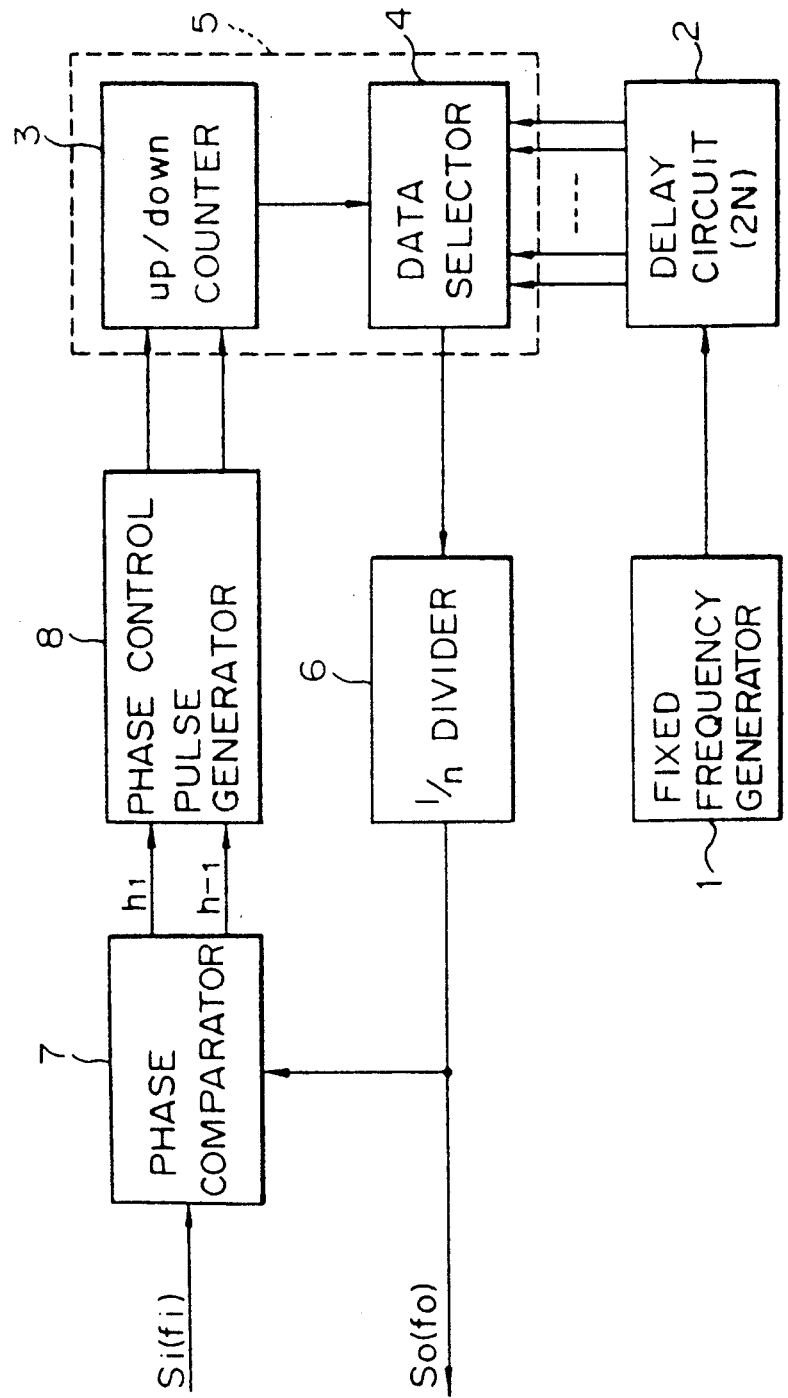
FIG. 1 is a block diagram showing an example of a digital PLL circuit according to the prior art.

FIG. 1 is a block diagram showing a digital PLL circuit disclosed in Japanese Unexamined Patent Publication (Kokai) No. 61-208923.

The circuit is used for obtaining an output signal $S_0$ having a frequency of $f_0$ which is phase-synchronized with an input signal $S_i$ having a frequency of $f_i$. A fixed frequency generator 1 generates a signal having a frequency of $nf_0$ which is an integer (n) multiple of $f_0$. A delay circuit 2 delays the signal to make 2N output signals having a time difference of $\tau = \frac{1}{2}Nnf_0$, one by one. A phase changing circuit 5 comprising an up-/down counter 3 and a data selector 4 selects one of the output signals of the delay circuit 2 to control the phase of an output signal. A 1/n divider 6 divides the frequency of the output signal of the data selector 4 by n to output a signal $S_0$.

Phase comparator 7 compares the phase of the input signal $S_i$ with the phase of the output signal $S_0$ of the divider 6 and outputs a phase advance signal $h_1$, a phase delay signal $h_{-1}$, or a phase coincidence signal $h_0$, depending on whether the phase difference is larger than $\tau/2$ or not. Phase control pulse generator 8 watches the signal from the phase comparator 7 and when it detects a predetermined number "m" of successive $h_1$ or $h_{-1}$ it outputs a signal for varying the value of the up/down counter 3 by +1 or −1, respectively, to reduce the detected phase difference, and thereby corrects the phase of the signal $S_0$.

Thus, an output signal phase-synchronized with the input signal within a maximum phase difference of $\tau/2$ is obtained.

In the circuit shown in FIG. 1, the phase of the output signal can only be varied by $\tau$ in each control operation cycle, even in the initial lead-in operation. As "m" phase comparisons are necessary to vary the phase by $\tau$, m × n × N phase comparisons are necessary for coincidence of the phases when the phase difference between the input and output signal is 180°. Thus, the lead-in time for coincidence of the phases in the initial state is quite long in the circuit shown in FIG. 1.

The preferred embodiment of the present invention will now be described with reference to the accompanying drawings.

Figure 2:
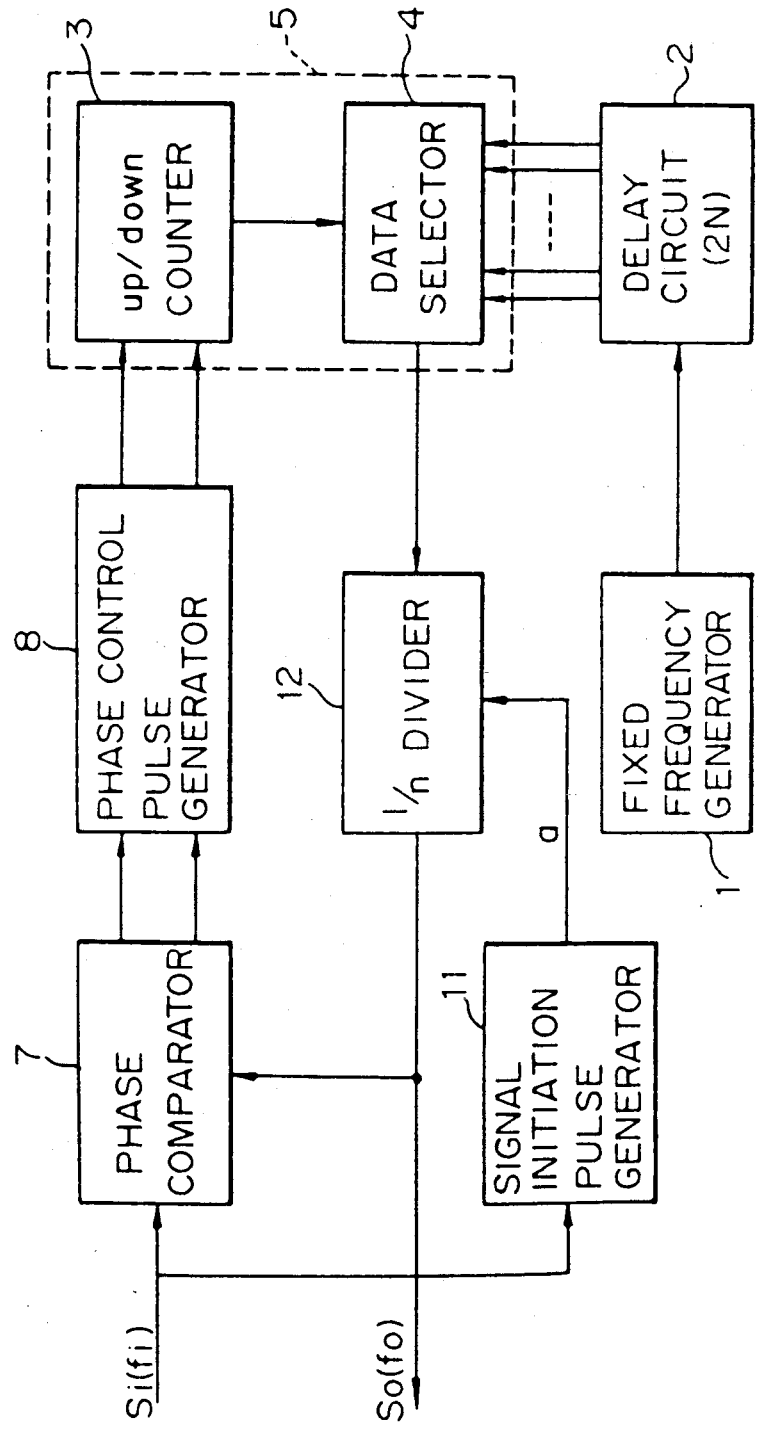
FIG. 2 is a block diagram showing a digital PLL circuit according to the present invention.

FIG. 2 is a block diagram showing a digital PLL circuit according to the present invention.

The same reference numerals are used on the same elements as shown in FIG. 1, so explanations thereof are left out.

Signal initiation pulse generator 11 watches the input signal and generates a pulse signal having a pulse width of $T = \frac{1}{2}nf_0$ when it detects the start of the input signal. It can not output an additional pulse even if it detects an additional input signal, until the input signal is interrupted for a predetermined time interval.

Unlike the 1/n divider 6 in FIG. 1, 1/n divider 12 has an input for setting an internal counter to a predetermined value. While the input is active, the internal counter of the 1/n divider 12 is set to n/2.

Figure 3:
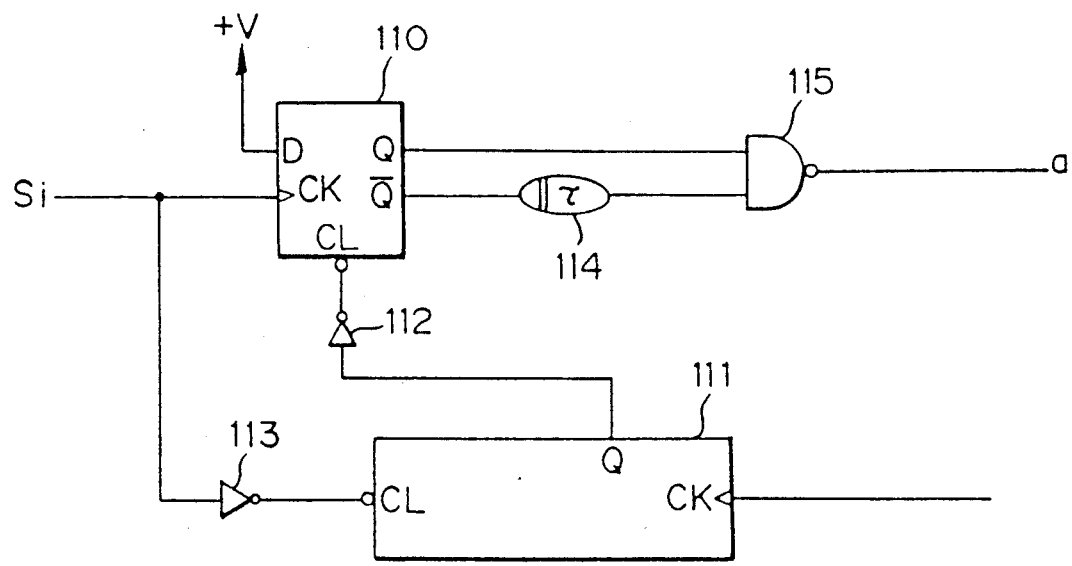
FIG. 3 is a circuit diagram showing the detailed construction of the signal initiation pulse generator 11 shown in FIG. 2.

FIG. 3 is a circuit diagram showing the detailed construction of the signal initiation pulse generator 11.

A clock input of a D-flip-flop 110 is connected to the input signal $S_i$ and a D-input of the D-flip-flop 110 is connected to a logic "1". A noninverted output of the D-flip-flop 110 is connected to one input of a NAND gate 115 and an inverted output of the D-flip-flop 110 is connected through a delay circuit 114 to the other input of the NAND gate 115. A delay time $\tau$ of the delay circuit is $\frac{1}{2}nf_0$. Therefore, when the input signal $S_i$ changes from logic "0" to logic "1" the NAND gate 115 outputs a pulse having a pulse width of $\frac{1}{2}nf_0$. A counter 111 is used for inhibiting an additional pulse until the input signal is interrupted for a predetermined time interval. A clear input of the counter 111 is connected through the inverter 113 to the input signal $S_i$. While the clear input of the counter 111 is inactive the counter 111 counts clock pulses input from a clock input. After the counter 111 counts a predetermined number of clock pulses, namely, after the predetermined time interval, an output Q of the counter 111 goes to a logic "1". The output of the counter 111 is connected through the inverter 112 to the clear input of the D-flip-flop 110. After the input signal $S_i$ changes from logic "0" to logic "1" and the NAND gate 115 outputs the pulse, the next pulse is inhibited if the next input signals follow within the predetermined time interval, because the D-flip-flop 110 is not cleared.

Figure 4:
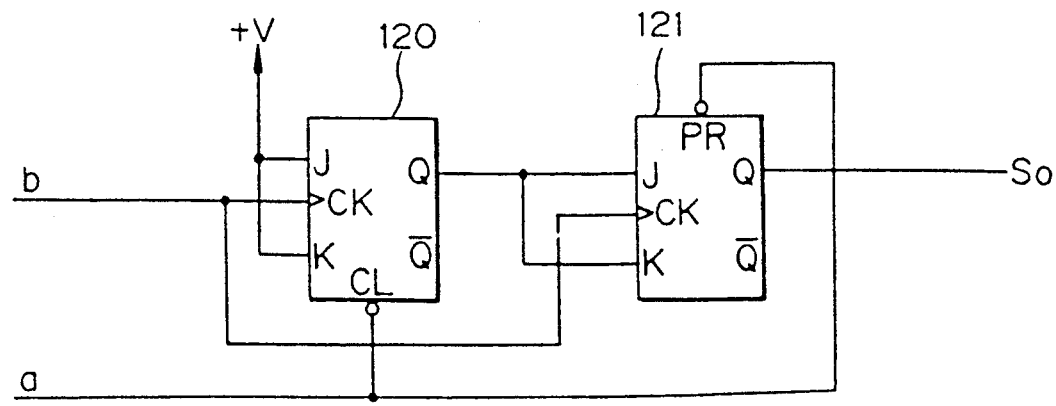
FIG. 4 is a circuit diagram showing the detailed construction of the 1/n divider 12 shown in FIG. 2.

FIG. 4 is a circuit diagram showing a well-known construction of a 1-/n divider 12 where n=4. While a set signal "a" is active, namely a logic "0", JK-flip-flop 120 is cleared and JK-flip-flop 121 is set to logic "1". This indicates a state "2", namely, state "n/2".

Figure 5:
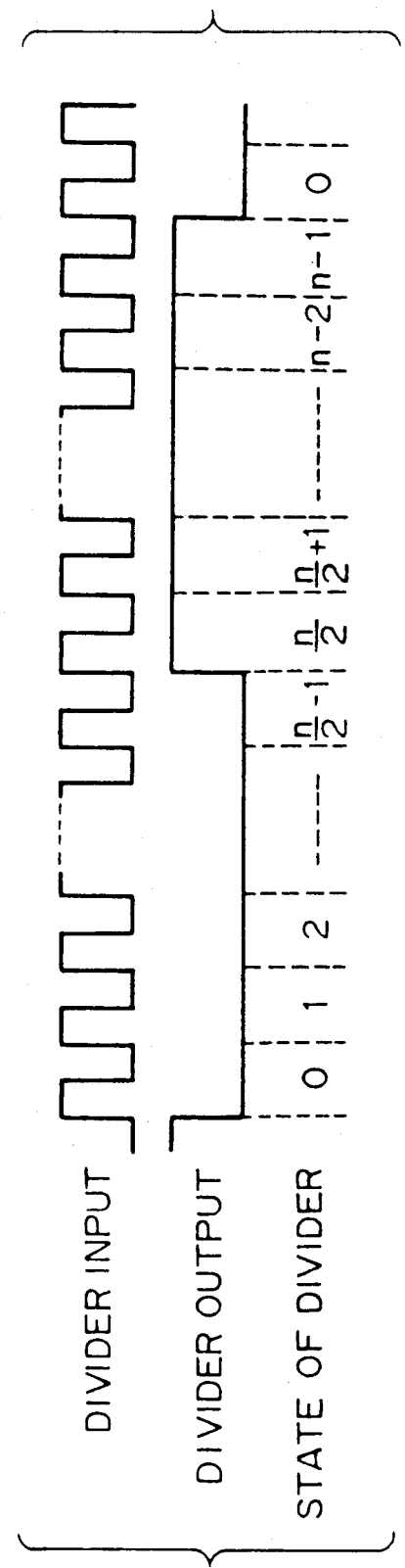
FIG. 5 is a timing chart for defining the operation and status of the divider.

FIG. 5 is a timing chart for explaining the operation and status of the 1/n divider 12. As shown in FIG. 5, the 1/n divider 12 raises its output when its state becomes n/2.

Figure 6:
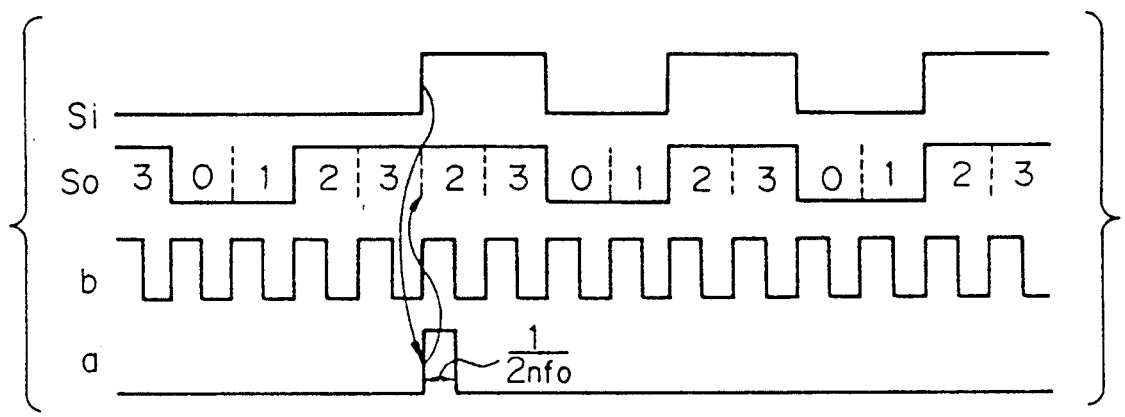
FIG. 6 and FIG. 7 are timing charts for explaining the operation of the circuit according to the present invention.
Figure 7:
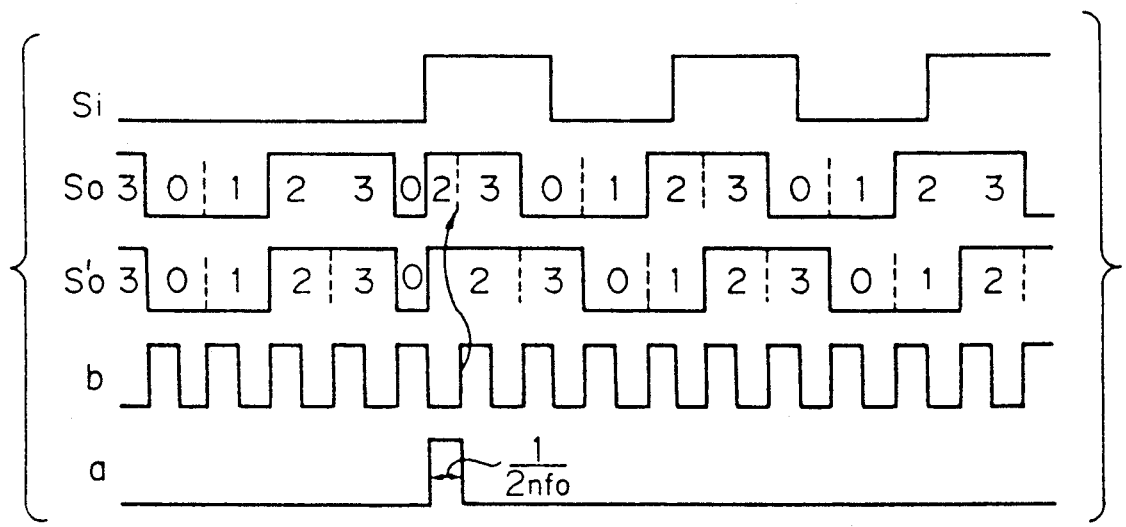

FIG. 6 is a timing chart for explaining a lead-in operation in the case where the phase difference between the input signal S and the output signal $S_0$ is 180°. In order to explain concretely, we will assume a division factor of 4 (n=4) and a partition number of the phase 8 (N=4). Though the circuit shown in FIG. 3 outputs a negative pulse, the pulse "a" is shown as a positive pulse in FIGS. 6 and 7.

When input signal $S_i$ is raised, the signal initiation pulse generator 11 generates a pulse in "a" and the pulse then sets the divider 12 to n/2=2. As shown in the FIG. 3, in this case, phase synchronization is performed immediately, and thereafter the circuit operates in the same manner as the circuit of the prior art. Therefore, the initial lead-in time is zero.

In the circuit of the present invention, the condition where the initial lead-in time is the longest occurs when the phase difference between the input signal and the output signal is $1/(2nf_0) \times (2k+1)$ where k is an integer. For example, the case where it is $1/(2nf_0) \times 3$ is explained using the timing chart of FIG. 7. The condition n=4 and N=4 is the same as in FIG. 6.

When the input signal $S_i$ is raised, the signal initiation pulse generator 11 generates a pulse in "a", which sets the divider 12 to n/2=2. In this case, when the pulse in "a" becomes inactive, the output "b" of the data selector 4 is raised at the same time. Therefore, there may be two cases where the output "b" is active and where the output "b" is inactive. In the former case, the state of the divider 12 and its output are as shown in $S_0$ of FIG. 7. In the latter case, they are as shown in $S_0$ of FIG. 7. In both cases, however, the phase difference from the input signal is $1/(2nf_0)$ ($=\tau/N$), and $m \times N = 4m$ phase comparisons are required to perform phase synchronization.

It can be realized that a maximum of $m \times n \times N$ phase comparisons are required to lead-in in the circuit according to the prior art, whereas a maximum of $m \times N$ times are required in the present invention and therefore, the lead-in time is reduced to $1/n$.

We claim:

1. A digital PLL circuit for outputting a clock signal phase-synchronized with an input signal comprising:

a fixed frequency generator generating an output signal having a frequency which is n-times as large as a frequency $f_0$ of the clock signal, a delay circuit generating a plurality of signals formed by giving predetermined and various phase differences to the output signal of said fixed frequency generator, a phase changing circuit successively selecting one of said plurality of signals depending on a control input to output the selected signal, a divider dividing a frequency of the output signal of said phase changing circuit by n to output said clock signal, a phase comparator comparing a phase of said clock signal with a phase of said input signal, and a phase control pulse generator outputting a control signal to said phase changing circuit depending on a result of comparison of said phase comparator, characterized in that said divider being able to be set to a predetermined state in which said divider raises said clock signal, and that the digital PLL circuit further comprises a signal initiation pulse generator generating a signal to set said divider to said predetermined state depending on said input signal initiation.

2. A digital PLL circuit as claimed in claim 1, wherein said phase changing circuit comprises an up-/down counter and a data selector, a value of said up-/down counter is varied depending on the output signal of said phase control pulse generator, and said data selector selects one of said plurality of signals depending on the value of said up/down counter.

3. A digital PLL circuit as claimed in claim 2, wherein said phase comparator outputs a phase advance signal, a phase delay signal, or a phase coincidence signal, depending on whether or not the phase difference is larger than a predetermined value, and said phase control pulse generator watches the signal from said phase comparator and when it detects a predetermined successive number of said phase advance signals or said phase delay signals it outputs a signal for varying a value of said up/down counter by +1 or −1, respectively.

4. A digital PLL circuit as claimed in claim 3, wherein said signal initiation pulse generator generates a signal which become inactive when time corresponding to a half cycle of the output signal of the fixed frequency generator has passed after said input signal initiation, and the internal state of said divider is set to a state which said divider assumes after raising its output, while said signal is active.

5. A digital PLL circuit as claimed in claim 4, wherein said signal initiation pulse generator generates the signal having a pulse width of said half cycle of said output signal of said fixed frequency generator after said input signal initiation.

* * * * *